(12) United States Patent
Arai et al.

(10) Patent No.: US 7,024,433 B2
(45) Date of Patent: Apr. 4, 2006

(54) PARTS DESIGN CHANGE SUPPORTING SYSTEM, PROGRAM, AND RECORDING MEDIUM

(75) Inventors: Shuko Arai, Zushi (JP); Makoto Moriguchi, Kawasaki (JP); Hiroshi Ohno, Mobara (JP); Yumiko Hayashi, Tokyo-to (JP)

(73) Assignee: Ricoh Company, Ltd., Yokohama (JP)

( * ) Notice: Subject to any disclaimer, the term of this patent is extended or adjusted under 35 U.S.C. 154(b) by 431 days.

(21) Appl. No.: 10/279,006

(22) Filed: Oct. 24, 2002

(65) Prior Publication Data

US 2003/0097642 A1 May 22, 2003

(30) Foreign Application Priority Data

Oct. 25, 2001 (JP) ............................. 2001-327290

(51) Int. Cl.
G06F 17/30 (2006.01)
(52) U.S. Cl. .................................... 707/203; 707/104.1
(58) Field of Classification Search .............. 707/1–10, 707/100–104.1, 200–206; 705/29; 715/764–862
See application file for complete search history.

(56) References Cited

U.S. PATENT DOCUMENTS

| | | | |
|---|---|---|---|
| 5,191,534 A * | 3/1993 | Orr et al. ..................... | 700/105 |
| 5,864,875 A | 1/1999 | Van Huben et al. | |
| 6,574,679 B1 * | 6/2003 | Chliwnyj et al. ............. | 710/10 |
| 6,598,053 B1 * | 7/2003 | Yamazaki et al. .......... | 707/102 |
| 6,647,380 B1 * | 11/2003 | Yotsukura ....................... | 707/2 |

FOREIGN PATENT DOCUMENTS

EP 0 558 006 A 1/1993

OTHER PUBLICATIONS

Peng et al. ("A step toward STEP-compatible engineering data management: the data models of product structure and engineering changes", Robotics and Computer-Integrated Manufacturing 14, 1998, pp. 89-109).*
Peng et al., "A step toward STEP-compatible engineering data management: the data models of product structure and engineering changes", Robotics and Computer-Integrated Manufacturing 14 (1998) 89-109.
Roy et al., "Development of a manufacturing engineering system for the motor industry", Innovation in Technology Management—Key to Global Leadership, Portland, Jul. 27-31, 1997, Portland International Conference on Management of Engineering and Technology. PICMET, New York, IEEE, US, Jul. 27, 1997, pp 668-671.

* cited by examiner

Primary Examiner—Jean M. Corrielus
Assistant Examiner—Joon Hwang
(74) Attorney, Agent, or Firm—Morrison & Foerster LLP

(57) ABSTRACT

In order to support a system of changing a design of a parts constituting a product, both a parts composition information database for storing and supervising parts compositions of various products, and a related section information database for storing various sections and/or persons in charge of assessing design change capability in connection with the product are provided. Information of design change objective is input so as to retrieve and specify one or more products employing the design change parts from the parts composition information database in accordance with the input parts information. In accordance with the specified product, the related section information database is retrieved so as to select sections and/or persons. A request for assessing the parts design change capability is electronically transmitted to the selected one or more sections and/or persons. Plural assessment resultants are received from the assessment requesting destinations so as to determine if a formal design change instruction can be released.

17 Claims, 13 Drawing Sheets

FIG. 3

RELATED SECTION INFORMATION REGISTRATION

MODEL [ ] [B00400]  [RETRIEVAL] [REFERENCE]

| Field | Value |
|---|---|
| MODEL LEADER | |
| REGISTRANT | |
| ASSEMBLING TOTAL INSPECTION DIVISION | [ ] REGISTRATION DATE [ ] BASES [ ] |
| LEADER | |
| PERSON IN CHARGE | |
| REGISTRANT | |
| ASSEMBLING-INSPECTION DIVISION | [5B4] REGISTRATION DATE [2001/02/05 11:19:34] BASES [ ] |
| LEADER | |
| PERSON IN CHARGE | |
| REGISTRANT | |
| ASSEMBLING-INSPECTION DIVISION | [5B4] REGISTRATION DATE [1999/09/15 19:04:53] BASES [ ] |
| PERSON IN CHARGE | |
| REGISTRANT | |
| SERVICE CONTROL-TRANSFER FLAG | [1]  [1999/09/15 19:04:53] |
| SERVICE INSPECTION-DIVISION | REGISTRATION DATE [2000/05/01 13:59:50] |
| MAIN PERSON IN-CHARGE | [SUZUKI/R/RICOH] |
|  | [WAKAMATSU/R/RICOH] |
| REGISTRANT | [NOGUCHI/R/RICOH] |
| OEM INSPECTION-DIVISION | [ ] REGISTRATION DATE [ ] |
| PERSON IN CHARGE | |
| REGISTRANT | |
| BABT FLAG | [0] REGISTRATION DATE [ ] |
| REGISTRANT | |
| LAW GOVERNING-(COMMUNICATION) FLAG | [1] REGISTRATION DATE [ ] |
| REGISTRANT | |

[CANCEL]   [REGISTRATION] [CHANGE] [DELETE]

[END]

FIG. 5

```
COMMUNINET-IHOST01                                                    _ □ ×
CONTROL(C) EDITION(E) SETTING(S) OPTION(O) MACRO(M) HELP(H)
```

* CHANGE PARTS NUMBER INSTRUCTION *

010-08-16
1/2
INSTRUCTION NUMBER: 4SG771E034

| ADMINISTRATION CODE | [ . ] < | N:P/N CHANGE | K:COMPOSITION CHANGE | S:BASS PRIVATE USE |
|---|---|---|---|---|
| CHANGE PARTS NUMBER | [ ] | R:MECHANICAL CHANGE | E:INPUT END | D:USAGE MODEL LIST |
| | | U:COMPATIBILITY OLD PARTS TREATMENT CORRECTION | | M:PARTS⇔MECHANICAL |
| | | | | C:COPY |
| | | | | T:CANCEL IN BLOCK |

| CHANGE PARTS NUMBER | CAREER | SFX | SIZE | PARTS NAME |
|---|---|---|---|---|
| B0513014 | K | | ND | DEVELOPING UNI:BK:EXP:COMPLETE ASSEMBLING |
| B0513015 | K | | ND | DEVELOPING UNI:M:EXP:COMPLETE ASSEMBLING |
| B0513016 | K | | ND | DEVELOPING UNI:Y:EXP:COMPLETE ASSEMBLING |
| B0513017 | K | | ND | DEVELOPING UNI:C:EXP:COMPLETE ASSEMBLING |
| G0703020 | NK | G | ND | DEVELOPING UNI:BK:COMPLETE ASSEMBLING |
| G0703021 | NK | G | ND | DEVELOPING UNI:M:COMPLETE ASSEMBLING |
| G0703022 | NK | G | ND | DEVELOPING UNI:Y:COMPLETE ASSEMBLING |
| G0703023 | NK | G | ND | DEVELOPING UNI:C:COMPLETE ASSEMBLING |
| G0703056 | N | D | A2 | DEVELOPING SLEEVE:COATING |
| G0703103 | N | D | A4 | SLIDE BEARING:PADDLE:ASSEMBLING |
| G0703104 | N | C | A4 | SLIDE BEARING:PADDLE |
| G0703113 | N | J | A4 | BRACKET:TERMINAL:SUPPLYING ROLLER:ASSEMBLING |

```
KEY OK  ONLINE READY   ALPHA NUMERAL    ALPHA NUMERAL    CSS
```

FORM B

INSTRUCTION NUMBER: 4SB0004E348  DISPLAY SWITCH: ⦿ FORMAL FORM B  ○ TECHNICAL FORM B

| | | CHANGE CONTENTS | | | | | | USAGE NUMBER OF ITEMS | |
|---|---|---|---|---|---|---|---|---|---|
| | CHANGING MATTERS | OLD COMPOSITION | CHANGING MATTERS | NEW COMPOSITION | COM-PATI-BILITY | COMBI-NATION | OLD PARTS USAGE | OTHER USAGE | WARE HOUSING UNIT | OLD NUMBER OF ITEMS | NEW NUMBER OF ITEMS |
| 38 | MODEL | B002-00 [ 1 ] | | | | | | | | | |
| 39 | MODEL | B003-00 [ 1 ] | | | | | | | | | |
| 40 | MODEL | B004-00 [ 1 ] | | | | | | | | | |
| 41 | MODEL | B005-00 [ 1 ] | | | | | | | | | |
| 42 | MODEL | B006-00 [ 1 ] | | | | | | | | | |
| 43 | MODEL | B007-00 [ 1 ] | | | | | | | | | |
| 44 | MODEL | B008-00 [ 1 ] | | | | | | | | | |
| 45 | 2 | B0043054J | 2 | B0043054K | XO | | Z | | | 1 | |
| 46 | 2 | *A2323067C | 2 | *A2323067D | OO | | K | | | 1 | 1 |
| 47 | 2 | *B0043056B | 2 | *B0043056C | OO | | K | | 1 | 1 | 1 |
| 48 | 2 | **B0049057B | 2 | **B0043057C | | | | | 1 | 1 | 1 |
| 49 | 4 | ***A2329555A | 2 | ***B0043058B# | OO | | | | | 1 | 1 |
| 50 | 2 | ***B0043058A | 1 | ***B0043059 | | | K | | | | 1 |
| 51 | | | | | | | | | | | |
| 52 | | | | | | | | | | | |

COMBINATION COMPATIBILITY ◄ ▶

| WORKING OUT MODEL | | | | | | | | | | | | |
|---|---|---|---|---|---|---|---|---|---|---|---|---|
| -24 | -26 | -27 | -29 | -55 | -57 | -62 | -67 | -88 | -00 | -15 | -17 | -19 |
| B005 | -00 | | B006 | -00 | -14 | G065 | -67 | -17 | B007 | -15 | B004 | -00 | -17 | -27 | B008 |
| -26 | -27 | | G055 | -00 | -14 | -15 | -14 | -00 | -14 | -22 | -24 | -26 | -27 | -85 |

PRINTING    LEGEND DISPLAY

FIG. 6B

| ○ DESIGN TECHNICAL FORM B | | | | | | |
|---|---|---|---|---|---|---|
| NEW ARRANGE-MENT | GOING NATIVE PARTS | MEASURE-MENT UNIT | SERVICE | NEW PLATE | NAME | |
| | | | | | | |
| | | | | | | |
| | | | | | | |
| | | | | D | | DEVELOPING TANK:ASSEMBLING |
| | | | | D | | DUPLEX TAPE:DENSITY SENSOR |
| | | | | | | DEVELOPING TANK:SMALL ASSEMBLING |
| | | | | | | CASING:DEVELOPMENT:ASSEMBLING |
| | | | | A4 | | BALL BEARING:Φ12×Φ2 |
| | | | | | | CASING:DEVELOPMENT |
| | | | | | | BALL BEARING:Φ12×Φ2 |

-21 -22 -24 -26 -27 -29 -55 -57 -85
-00 G034 -00 -05 G035 -15 -17 -22
-86 G525 -00 -17 -27

END

FIG. 8

ASSEMBLING PERFORMANCE INSPECTION SETTING

LARGE MODEL : [G027] [RETRIEVAL]

| | LARGE MODEL | ASSEMBLING TOTAL ASSESSMENT DIVISION | BASES | REGISTERED DATE | REGISTRANT |
|---|---|---|---|---|---|
| 1 | G027 | 1G | ATSUGI | 1999/05/19 | MR.MORIGUCHI |

| | SMALL MODEL | ASSEMBLING PERFORMANCE INSPECTION DIVISION | BASES | REGISTERED DATE | REGISTRANT |
|---|---|---|---|---|---|
| 1 | G02717 | 1G | ATSUGI | 1999/06/22 | MR.ABE |
| 2 | G02720 | 1G | | 1999/06/11 | MR.ABE |
| 3 | G02727 | 1G | ATSUGI | 1999/06/22 | MR.ABE |
| 4 | G02757 | 2G | ATSUGI | 1999/06/12 | MR.TANAKA |
| 5 | G02767 | | | | |

ASSESSMENT DIVISION SETTING [2G ▼]    BASIS SETTING [ATSUGI ▼]

[END]

PARTS DESIGN CHANGE SUPPORTING SYSTEM, PROGRAM, AND RECORDING MEDIUM

CROSS REFERENCE TO RELATED APPLICATIONS

This application claims priority under 35 USC §119 to Japanese Patent Application No. 2001-327290 filed on Oct. 25, 2001, the entire contents of which are herein incorporated by reference.

BACKGROUND OF THE INVENTION

1. Field of the Invention

The present invention relates to a design change supporting system, program and recording medium. More particularly, the invention relates to a design change supporting system capable of corresponding to globalization of both product supply and service systems, and program capable of executing an operation of such a design change supporting system. The present invention also particularly relates to a recording medium capable of storing such program.

2. Discussion of the Background Art

Recently, user needs with regard to a product have become increasingly diversified, and collection of products suitable for both Japan and other international destinations, such as North America, Europe, etc., is progressively expanded. As a result, similar products having substantially the same parts construction are increasingly simultaneously produced even by the same manufacturer both in domestic and foreign countries at a plurality of facilities, in parallel. Further, in order to improve efficiency of development and credibility and to decrease the cost of a product, units and parts are commonly designed even if those are of different models.

A product band, whose parts are strikingly made into common, is designed both in domestic and foreign countries, and is hence produced at a plurality of production facilities. In addition, a service system for sold products is dispersed and expanded to a plurality of service facilities both in domestic and foreign countries. In this way, product supplying and servicing systems are becoming increasingly global.

Further, when the design for a part of a product is changed, the designer of the part should grasp the entire products and bases affected by the design change, and request an assessment of the design change capability of these facilities. FIG. 12 is a conventional workflow illustrating an operational stream starting from parts design change ending to the product's release. Specifically, when a product is to be modified or improved, the designer prepares a design change instruction, obtains an examination approval stamp within the division, and transmits, by means of a written document, a request for inspection of conformity to a standard, which the product has applied for and obtained. Further, manufacture and service engineers and the like transmit result of technical and functional inspections, such as assembling and parts processing performance, service performance in a market, and a need for approval from an OEM destination in accordance with an OEM contract in the case of an OEM product. Thus, inspections are routinely performed in this way. Then, in accordance with such inspection results, a design change instruction is approved and released, and hence instruction executing the design change are distributed to related divisions to be executed.

Due to the above-described globalization of the product supply and service systems, it is difficult for the designer to maintain control over entire products employing a design changing objective parts and production and service facilities. In addition, it unavoidably takes an enormous period of time until the design change is finally accepted and is notified in detail to related sections in a company, if these related divisions serially perform inspections.

The Japanese Patent Application Laid Open No. 10-63708 proposes a drawing processing system that facilitates design change by electronically executing a workflow necessary for the design change. In such a conventional technology, a workflow electronically and sequentially issues a design change instruction describing instructive contents of the design change to a prescribed approval stamp affixer, and the like, in order to get approval. However, there exists no awareness of such a subject that an section or a person in charge, affected by the design change are effectively selected without leakage in correspondence with the globalization of the above-described product supply and service systems. Accordingly, a device or system for resolving such a subject has not been described.

SUMMARY OF THE INVENTION

Accordingly, the present invention addresses and resolves the need stated above and other problems, and provides a new design change supporting system for supporting a system. The above and other objects are achieved according to the present invention by providing a novel design change supporting system for a system for changing the design of parts constituting a product that includes a parts composition information database, to permit storing and supervising parts compositions for various products. An information database is provided to permit storing various sections and persons in charge of assessing capability of design change in connection with a product. A design changed parts information inputting device is provided so as to input information of a design change objective part. A product specifying device is configured to retrieve and specify one or more products employing the design changed parts from the parts composition information database in accordance with the input parts information. An assessment destination selecting device is configured to retrieve and select the sections and/or persons from the related section information database in accordance with the specified product. A transmitting device is configured to electronically transmit a request for assessment of capability of changing a design of the parts to the selected one or more sections and/or persons. A reception device is configured to receive resultant of the capability assessment from the sections and persons so as to determine if a formal design change instruction can be released.

In another embodiment, the design change supporting system stores the sections and/or persons, who are in charge of assessing design change capability from the assembling, processing, and servicing performance points of view, and determine conformity to a standard, and necessity of approval from an OEM ("original equipment manufacturer") product providing destination, in connection with the product.

In yet another embodiment, the assessment destination selecting device in the design change supporting system does not allow a designer to arbitrarily change of the sections and/or persons.

In still yet another embodiment, the transmitting device of the design change supporting system simultaneously transmits the requests for assessment of design change capability to the sections and/or persons selected by the assessment destination selecting device.

In still yet another embodiment, the related section information database of the design change supporting system stores the sections and/or persons in connection with the product. In addition, the transmitting device selects one or more sections and/or persons who assess inconsistencies from the related section information database and transmits the inconsistent assessments thereto when the assessment results received by the reception device are inconsistent.

In still yet another embodiment, a drawing database of the design change supporting system stores both before and after design change drawings in connection with a product. Also included is a display control device configured to display both before and after design changed drawings of the assessment requested objective parts on the same screen which are read from the drawing database.

In still yet another embodiment, the display control device in the design change supporting system distinctively displays both before and after design changed drawings.

In still yet another embodiment, the display control device in the design change supporting system displays the design changed drawing with it changed portion being prominently emphasized while being superimposed on or below an unchanged design drawing.

In still yet another embodiment, a drawing data updating device is provided in the design change supporting system, to update a plurality of changed drawings stored in the drawing database by establishing the most recently stored drawing as a formal drawing, when the assessment result, received by the reception device, indicates that design change is capable in multiple sections.

In still yet another embodiment, the related section information database in the design change supporting system stores sections to instruct execution of design change in connection with the product. The product specifying device specifies a product corresponding to the parts when the assessment resultant received by the reception device indicates that design change is capable in applicable one or more sections. A design change instruction database is configured to store design change instructions of the parts in connection with the parts. A design change instruction providing destination selecting device is configured to select one or more sections receiving instruction of changing a design of the specified product is provided from the related section information database. A design change instruction providing device is configured to provide a design change instruction of the parts to the design change instruction providing destination together with the design change drawing.

In still yet another embodiment, a program is provided so as to realize a function of the design change supporting system when read by a computer. In one embodiment, the invention is characterized in that a computer readable medium is provided so as to store the program described herein.

BRIEF DESCRIPTION OF THE DRAWINGS

More complete appreciation of the present invention and many of the attendant advantages thereof will be readily obtained as the same becomes better understood by reference to the following detailed description when considered in connection with the accompanying drawings, wherein:

FIG. 3 is a chart illustrating an exemplary screen used when related section information is registered therefrom;

FIG. 5 is a chart illustrating an exemplary screen to input a design change parts;

FIG. 6 is a chart illustrating an example of a screen to specify a parts and product of design change objectives;

FIG. 8 is a chart illustrating an example of a screen to set an assessment destination;

DETAILED DESCRIPTION OF THE INVENTION

Figure 1:
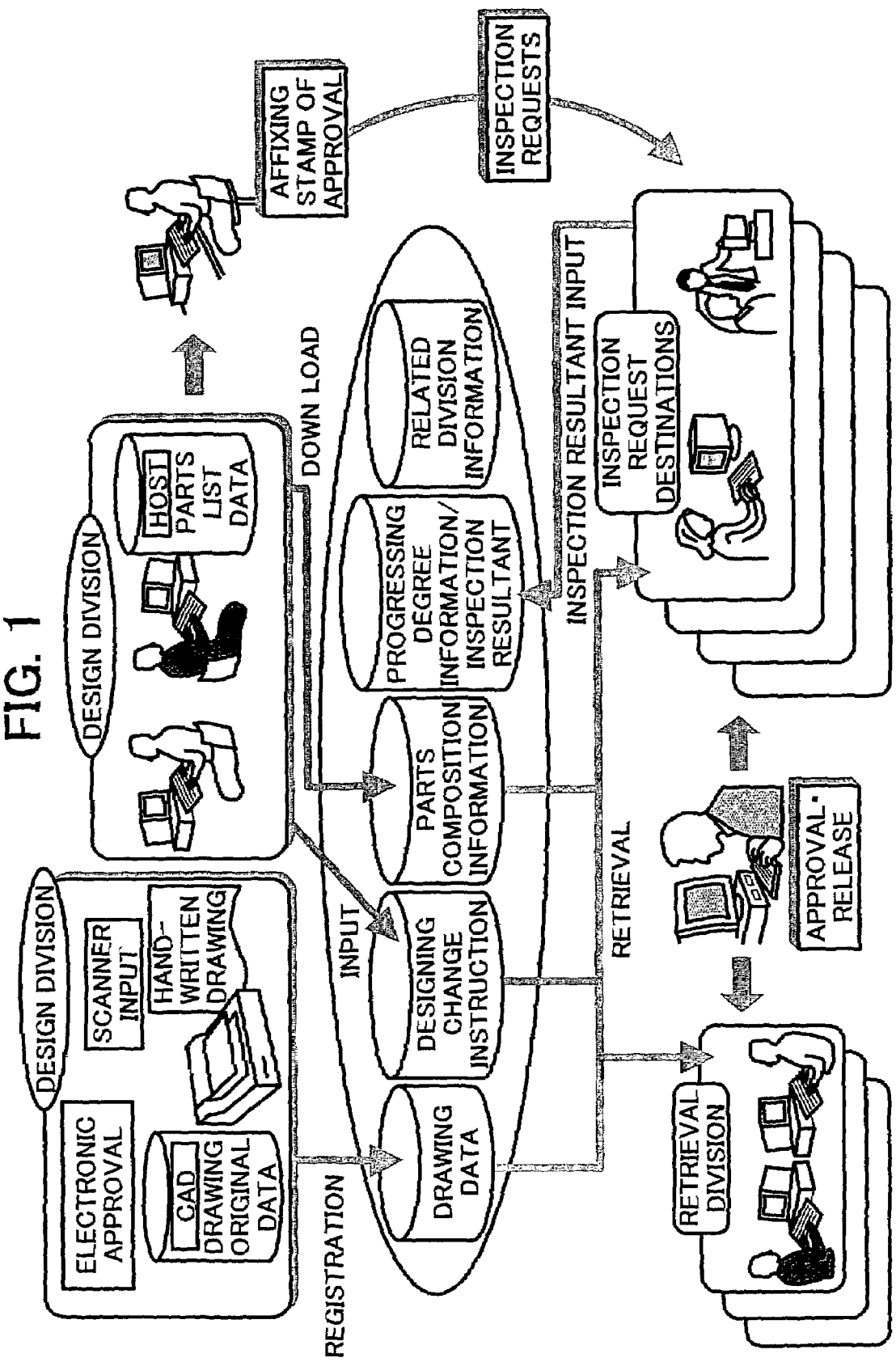
FIG. 1 is a chart illustrating the entire configuration that makes use of a design change supporting system as one embodiment of the present invention.

Referring now to the drawings, wherein like reference numerals designate identical or corresponding parts throughout several views, in particular in FIG. 1, the entire construction for administrating a design change supporting system according to one embodiment of the present invention is illustrated. First, a design section may prepare a design change instruction while considering and summing up optimal design changing details when receiving a request for a countermeasure against a problem, occurring on a quality of a design of a product either on the way of designing, producing, or working in a market. A designer may prepare such a design change instruction by designating a product that the designer desires to perform the design change and inputting items, such as an purpose, reason, contents, etc., designated in the design change instruction. Further, the designer may also prepare and register a drawing of a changed parts together with the design change instruction. Referring to parts composition information and an inspection section in accordance with the design change instruction and contents of changed parts, one or more design change capability inspection processes such as an assembling inspection process may be set and displayed by default. The designer confirms the necessity of each of the inspection processes. Approval stamp affixing may be performed in the design section, and then an inspection request may be simultaneously made to one or more inspection request sections, in parallel, in accordance with a workflow.

In the section serving as the inspection request destination, the following various design change capability inspections may be performed with reference to the design change instruction and corresponding drawing data (e.g. both before and after change drawings): Specifically, production and service engineers may perform both technical and functional inspections of assembling and parts processing performances, a service performance in a market, conformity to a standard that a product has applied and obtained, and necessity of approval in accordance with an OEM agreement in the case of an OEM objective product, respectively. The one or more sections may then return such inspection resultants to the design division. If a NG ("no go") decision comes among various assessment results from the various assessment destinations, a total assessment request may be forwarded to a total assessment division. When all inspections have been completed such that the design change is acceptable, sections or individuals having the authority to approve and release may be requested to approve and release the formal design change instruction. Instructions may be then transmitted to one or more sections that perform design change.

In such a workflow, in order to entirely administer and supervise design changes, the entire documents related to the design changes may be registered in the database and are open to public. In addition, a related section information database may maintain data for controlling a request for execution of a necessary process to the appropriate sections or individuals. In the related section information database, a systematic keyword, such as a code capable of distinguishing a product, a product name, a destination etc., may be registered for the entire products of production and sales objectives. Also registered may be various sections and/or individuals in charge of processes of the workflow per release of a new product. Those may be revised and maintained every time a person in charge of a section changes.

As the assessment and inspection accompanying design change, there may exist the following items. In addition, a workflow requesting for such assessments and inspections is set upon needs.

First, there exists the total assessment inspection. Specifically, even though a part is made into a common design, and hence the same parts is employed in different products at plural production facilities in both domestic and foreign countries, each facility performs an original production preparation and manufacturing process. Thus, in spite of changing a design in the same manner, inspections results of design change capability in assembling and processing performances are sometimes different from the other facilities. In such a situation, a process of a total assessment, which fully determines design change capability, can be performed. The total assessment may include determination of whether inspection requests are sent again to all of applicable inspection sections after modifying the design change after being rejected, and how such re-inspection may be performed. One or more total assessment sections for assessing the design change capability in assembling and processing processes are registered for a product in the related sectional information database. The total assessment sections are set by default in a total assessment portion of the related sectional information database in accordance with a product that has changed its design. In addition, by judgment of the design division in view of design change contents, a technical performance inspection division can be selected separately as a total assessment section. Thus, when there exists a NG judgement among the inspection results output by the various facilities, the design change instruction is automatically requested to be totally assessed and determined if the design change is going or not going to the total assessment section.

Second, there exists an assembling performance technology inspection as described below. When addition and alteration arise in a parts construction in accordance with a design change, various products commonly using a design change objective part are specified, and design change capability inspections are simultaneously requested in parallel to an assembling performance inspection section registered in the related section information database. The designer cannot neglect an assembling performance inspection request because the design change always affect thereto. When there exists a NG judgment (i.e., a request therefrom for addition and correction to the design changed contents), a total assessment request is sent to a total assessment section that determines, while considering capabilities of the various facilities, and sends total assessment back to the design section.

When there is no change in a drawing, the processing performance inspection may not be needed, due to identity of a design.

Persons belonging to various sections and in charge of a technical mater may be registered in the related section information database per a parts. The database may be updated whenever a new product or design change occurs. Further, lead departments having prepared production may also be registered for a product as a processing performance inspection section. Also in such a situation, if there exists a NG judgment among decisions from the lead departments (i.e., a request therefrom for addition and correction to the design changed contents), an assessment request may be made to the total assessment section so that the total assessment can be fed back to the design section.

Third, there exists a unit technology inspection as described below. When a product is configured from a unit, such as PCB, PSU, etc., unit design change technical capability is inspected for a unit that is performed for a product. Fourth, there exists a service technology inspection as described below. The service capability inspection section registers a person in charge of inspecting servicing capability in the related section information database after a mass production step and when servicing capability inspection is required. The service capability inspection section then inspects capability of reflecting changes in steps to service parts supplying and SE (service engineer) processes performed after the mass production and feeds the inspection resultant back to the design section.

Fifth, there exists a BABT inspection as described below. A BABT (British Approvals Board for Telecommunications) inspection section registers products requiring BABT approvals in the related section information DB. When there exists a BABT obtaining approval product among design change objectives, a BABT inspection request is sent to the BABT inspection section. The BABT inspection section confirms the contents. An inner company approver, who has been approved by an approval section of the BABT, judges necessity of the BABT approval.

Sixth is a standard conformity examination as described below. The standard conformity examination section registers various products, which have applied for and obtained certifications of Safety, EMC (Electro Magnetic Compatibility), and Communication, in the related section information database in connection with its standard examination section. When there exists such a product among the design change products, a standard conformity inspection is request thereto by the designing section with its discretion.

An OEM in house inspection is now described. When there exists an OEM sales product among design change executing objectives, an OEM destination approval is sometimes required in accordance with the contract. In such a situation, the OEM in-house inspection section determines an OEM supply objective product and registers it into the related section information database in connection with a person in charge of performing in-house inspection of the product. When one or more such persons have been registered for design change products, one or more in house inspection sections receive an inspection request, and judge necessity of approval from an OEM customer while referring to design change contents in view of the OEM contract.

Figure 2:
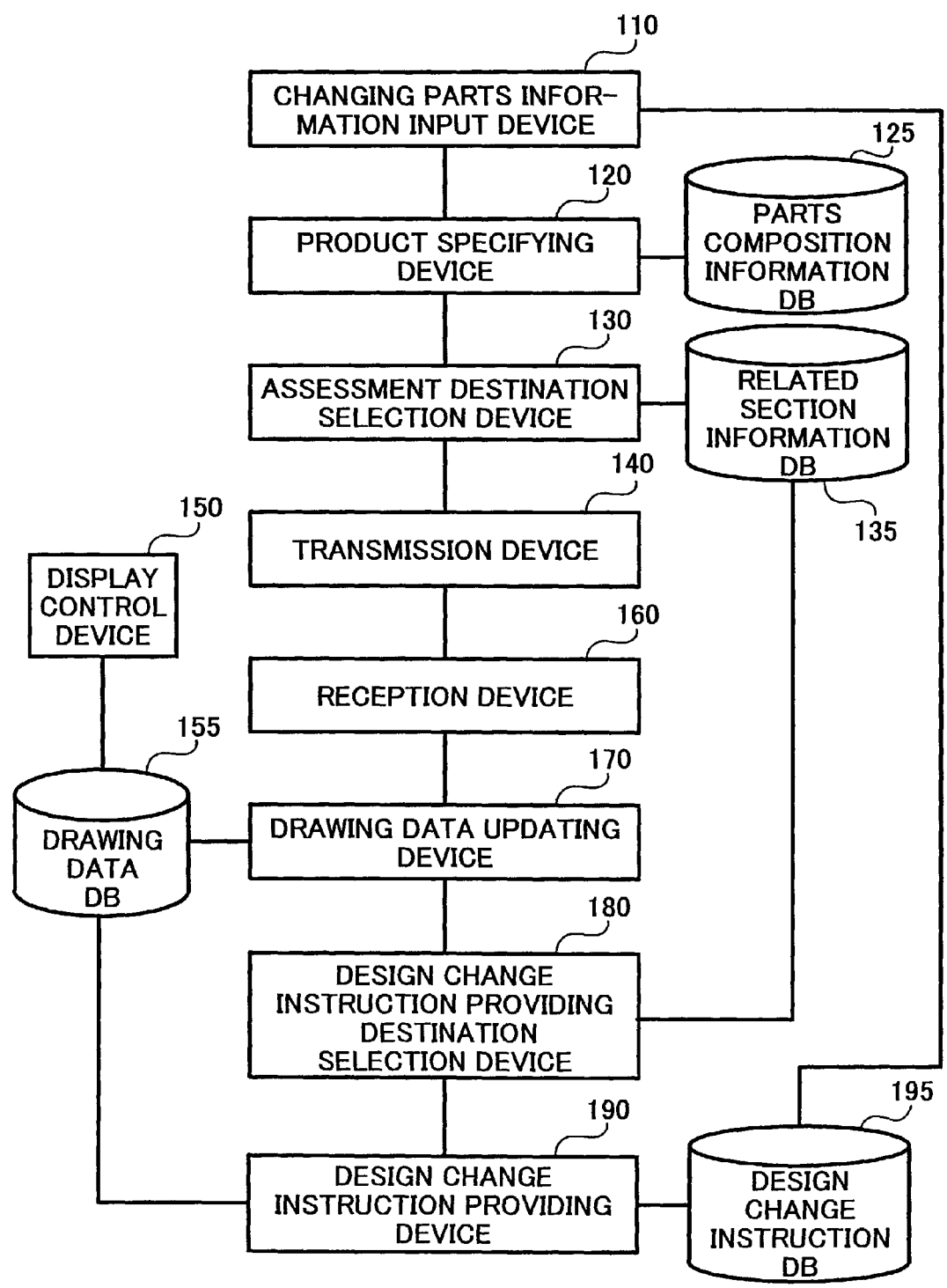
FIG. 2 is an explanatory block chart illustrating a functional configuration of a design change supporting system as one embodiment of the present invention.

FIG. 2 is a block chart illustrating one embodiment of a functional configuration of a design change supporting system. As there shown, the present system at least includes a changed parts information inputting device 110, a product specifying device 120, a parts composition information database (DB) 125, an assessment destination selecting device 130, a related section information database (DB) 135, a transmission device 140, a display control device 150, a drawing database 155, a transmission device 160, a drawing data updating device 170, an providing destination selecting device 180, an providing device 190, and a design change instruction database (DB) 195.

The above-described four databases utilized in the system are now described in more detail. First, the parts composition information database (DB) 125 is a parts table capable of managing a parts composition of various products, and includes two types of information such as a parts number and composition ledgers. The parts composition information database (DB) 125 is connected to a system for managing a product and parts production and service. The parts number ledger is a perpetual managing ledger including parts career, and defines managerial items, such as a parts number, drawing, etc. The parts composition ledger receives registry of a parts composition per a product and forms a hierarchical level of units and assemblies. The parts composition ledger manages and releases a parent-child relation, an arranging unit, a servicing unit, and a usage number of items, and the like.

The parts composition ledger performs data communication with the system for managing both production and service. The parts composition information database (DB) 125 releases a drawing of a design parts list after mass production of a new product is determined and before advancing to the next from trial production. The drawing is utilized for the purpose of commencing specific investigation in both production and servicing preparations, and setting of manufacturing steps. The parts composition information database 125 is updated every time a new product is added or a design change instruction is released.

Such data update is also performed within production and servicing systems. The parts composition information DB 125 includes both a production parts list, which additionally lists a manufacturing step per a production basis, and a product composition for production management use to be used when a parts is purchased and product assembling is instructed in accordance with a production plan. Further, the parts composition information DB 125 also includes the service parts list to be used when a service parts is purchased and managed.

The drawing database 155 converts original drawings in states of a paper and electronic data prepared manually and by CAD, respectively, into unified data formats. Thus, the drawing database 155 stores and supervises the history of changed drawings related to parts and assembling of the product. A designer can perform changes to one drawing at multiple times, in parallel. The plurality of changed drawings generated by the CAD are registered in the drawing database 155 as inspection use drawings, and registered in the design change instruction database (DB) 195 in connection with design change instruction so that their career can be supervised and is open to public. A changed drawing as a release objective among the plural changed drawings is registered in the drawing database 155 as a formal drawing. The drawing database 155 is utilized by a user at each facility when main pipe operations, such as product and parts manufacturing, assembling, inspection, and related supporting operations, and drawing inspection for product development and improvement or the like are performed. In particular, the drawing data database 155 is utilized as an inspection use drawing in the present system by setting a prescribed workflow for inspecting design change capability.

A revision is put to a parts number in a registration order whenever when an inspection use drawing is registered by the CAD, after having performed preparation and approval. The revision is assigned to the inspection use drawing so as to supervise its history.

Specifically, the inspection use drawing firstly registered is given "Rev. 1". When the firstly registered drawing is changed, "Rev. 2" is assigned to the changed drawing. Thereby, the revision is updated. The inspection use drawing having received repetitious inspections and plural registrations of revisions becomes a formal drawing when it is finally fixed by approval and release of the design change instruction. The formal drawing is registered with the drawing data DB 155. To render an inspection use drawing to a formal one, it is sufficient only to switch a flag representing drawing attribute information from inspection to formal states while maintaining the fixed inspection drawing data as it is. Thus, erroneous usage is prevented and use of a formal drawing is assured, while supervising the history of the entire formal drawings using a parts number and suffix, and hence differentiating an updated version of a drawing against an older version.

The related section information database 135 registers and maintains both products and supervisory items in order to perform necessary product management in an operation process and system for designing and producing. The related section information database 135 functions as a master DB of product management in cooperation with the parts composition information DB 125, and is properly promptly updated in accordance with both section change and employee movement. The related section information database 135 is utilized in a workflow that properly performs a design change capability inspection process requiring a separate design change. As described earlier, the related information database 135 is utilized when it is determined whether various design change capability inspections are to be requested. For example, it is used when a drawing change exists and hence processing performance technical inspection is requested, and when a product is of an OEM brand and hence approval is requested after OEM inspection is performed in the case of OEM product. Further, in order to instruct divisions and sections, which necessarily perform separate design changes, without exception, a prescribed specific inner workflow is set for each process.

As items supervised by the related section information DB 135, the followings are exemplified. A brand, destination, and product segment each divided and classified into product types; a product liability section, a design section, a technical section, and a service section, and the like, each of which relate to a design change processing workflow for a product; a person in charge of handling a design change processing workflow for a product type (registration upon needs), such as a window person in charge of a section, a press and mold parts engineer for a type of industry; a release information providing destination per a product type, such as a materials section, an inspection section, and a providing form, such as a paper, electron, CD-ROM, etc; and IDs and authorities of preparation, edition, approval, and reading to supervise usage authority.

Such a design change instruction database (DB) 195 is a database that keeps and supervises design change instructions, each formed from a document and drawing data respectively obligated to be prepared, in order to provide assurance of supervision of its history when the design change instruction database (DB) 195 changes the drawing and parts compositions. This design change instruction instructs design change and hence is utilized as an instruction document for performing the design change of the product. Since the drawing and related technical information are integrally managed for an instruction, various users, who perform the design change can arbitrarily designate and inspect the design change instruction. As a result, the various users can perform such an operation while readily retrieving and outputting desired related information. Such a design change instruction includes a document (e.g. a design change instruction format that A) describes a purpose, reason, examination, and approval of design change or the like, and changed instruction details (e.g. a design change instruction format; and B) such as new and old parts constructions, and a design change execution objective product (a running model) and the like of a specific parts.

Figure 4:
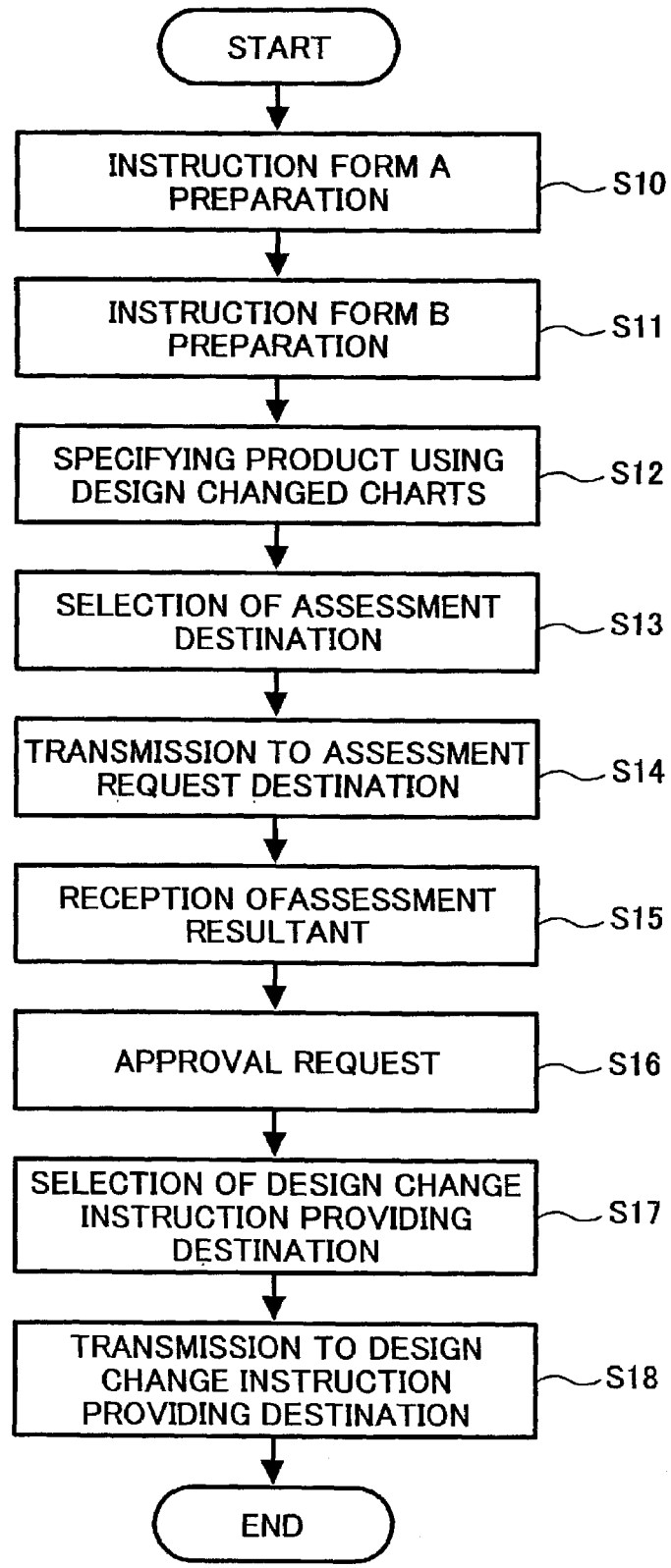
FIG. 4 is a flowchart illustrating a procedure of a design change supporting system as one embodiment of the present invention.

FIG. 4 is a flowchart illustrating processing steps of the one embodiment of the design change supporting system. With reference to the processing steps, the above-described respective functions of the changed parts information inputting device 110, product specifying device 120, assessment destination selecting device 130, transmission device 140, display controlling device 150, reception device 160, drawing data updating device 170, providing destination selecting device 180, and providing device 190 are described.

Upon receiving a request for a countermeasure against a problem with the design quality of a product operating in a market or in a process of designing and producing, a designer considers and summarizes optimal design change details, and prepares a design change instruction. The designer designates a product, which is desired by the designer to perform design change, and inputs designated items of a design change instruction, such as a purpose, reason, contents and the like, to a design change instruction format A using the changed parts information inputting device 110 (in step S10). In addition, he or she selects a the part to be changed from a screen similar to that shown in FIG. 5, and inputs old and new configurations of the changed parts as illustrated in FIG. 6. Thereby, the designer prepares a design change instruction format B (in step S11). Further, the designer prepares and registers a changed drawing using a CAD system in the drawing data DB 155. The old and new configurations of the changed parts and drawing are registered and stored in the design change instruction database (DB) 195, corresponding to the design change instruction.

Figure 7:
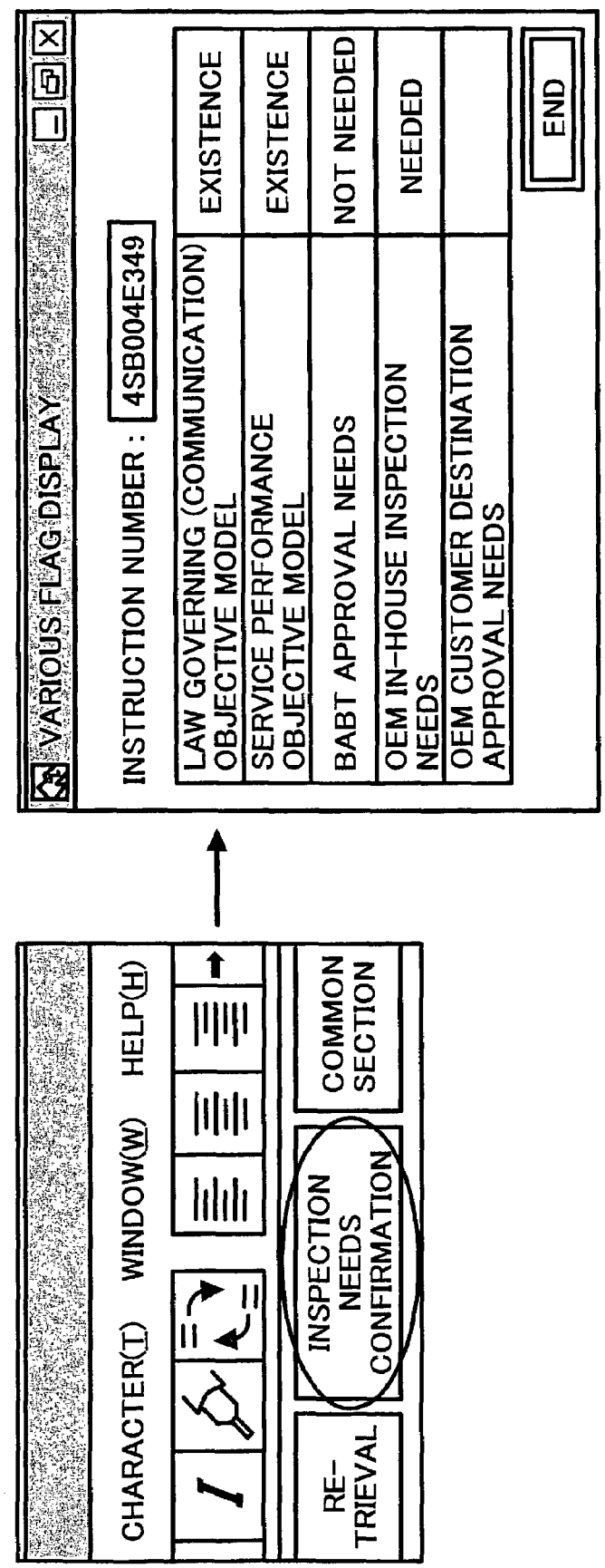
FIG. 7 is a chart illustrating an example of a screen to confirm a need of assessment and inspection.

The product specifying device 120 retrieves the entire products employing the design changed parts from the parts composition information DB 125 in accordance with the old and new configurations of the changed parts of the design changed instruction stored in the design change instruction database (DB) 195 as a changing objective (in step S12). The assessment destination-selecting device 130 extracts one or more assessment destinations necessary for the specified product with reference to the related section information DB 135. An inspection requesting process with regard to the extracted assessment destinations is set and displayed by default. The designer confirms the necessity for each inspection requesting process and corrects the inspection requesting process upon needs. The necessity of the inspection process can be confirmed by depressing an inspection necessity confirmation button as illustrated in FIG. 7. Such a necessity can also be corrected upon needs. For inspection requiring assessment, a list of assessment destinations is displayed with reference to the related section information DB related to the product (e.g. assembling performance inspection as illustrated in FIG. 8). From the list of the assessment destinations, a person in charge of inspection and its leader are set for each section. These are set for the entire sections on the list displayed in order to render the related sections to perform capability assessment without exception.

The transmission device 140 submits a design change capability inspection for each assessment destination in accordance with a set workflow in parallel after necessary correction of the design change capability inspection process is completed and an approval stamp is affixed (in step S14).

The users may occasionally inspect the progress status of requested assessment by referring to a progress list, listing both workflow and updated condition for a design change instruction. When similar type inspections are performed by multiple sections (e.g. a processing performance inspection is performed at multiple facilities commonly using a part), and the reception device 160 receives both OK and NG decision resultants, the designer considers changing in the contents, and requests for design change capability inspection again upon need when the design changed is changed. In this case, the workflow already set is not repeated, and a re-inspection workflow is set in view of a priority given to the process answering the NG, a progress condition (inspection complete or not) of the other process, and a degree of incidence of changed contents. Thus, by previously setting one or more sections in charge of total assessment to the related section information DB 135, a total assessment process is automatically added to the workflow when a conflicting judgment result arises. Then, inspection request is transmitted to the total assessment destination by the transmission device 140 (in step S15). In this manner, by adding the total assessment process, plural sections inspecting the similar types can be collected, and a proper answer can promptly be obtained.

Both the ordinal and total assessment destinations inspect while rubricating details, such as a graphic, numeric, etc., of the NG answer, or superimposing the rubric and drawing. The rubric data is registered in the design change instruction DB 195 as a child document of the design change instruction. Thus, mutual information communication and confirmation can be readily promptly achieved.

Further, upon entirely receiving OK assessment results after multiple inspections performed in parallel, the reception device 160 advances to a following process of approval of design change instruction (in step S16). After execution of such approval, the drawing data updating device 170 registers a finally fixed revision of the drawing among inspection use drawings, whose revisions are registered multiple times, with the drawing data DB 155 as a formal drawing. Upon releasing thereof, the design change instruction providing destination selecting device 180 selects a section, which receives instruction of design change, from the related section information database (DB) 135 (in step S17). The design change instruction providing device 190 transmits the design change instruction to the section of providing destination as a release instruction, thereby conveying the design change (in step S18).

Figure 9:
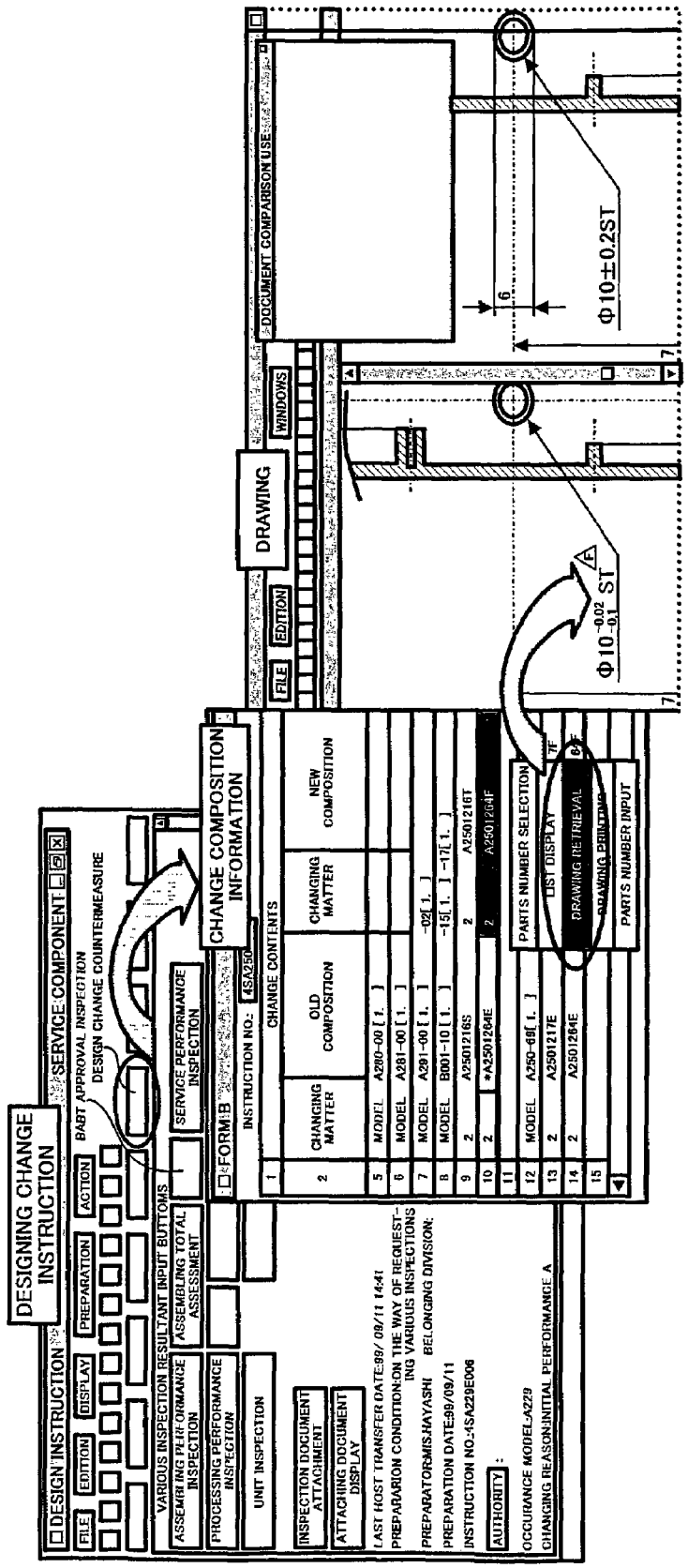
FIG. 9 is a chart illustrating an example of a designation screen for a user to inspect a design changed drawing.

The display control device 150 is now described. When a user of an assessment destination or a related division attempts to inspect a changed drawing, a design change instruction is displayed, as illustrated in FIG. 9. Then, the changed drawing of the drawing data DB 155 is readily retrieved and displayed when a "change configuration"

button on the screen is depressed, when a parts number is selected from parts information in the drawing list, and when a "drawing retrieval" is designated.

Further, when inspecting such a changed drawing, a markup can be displayed so as to emphasize a changed portion in the drawing.

Otherwise, document comparison can be displayed so as to readily differentiate and display a changed portion or content while overlapping the old and new drawings. Still otherwise, rubric of drawing correction prepared in accordance with inspection resultant can be displayed. Thus, confirmation can be performed without exception. As a result, an operation of drawing inspection can be executed.

Figure 10:
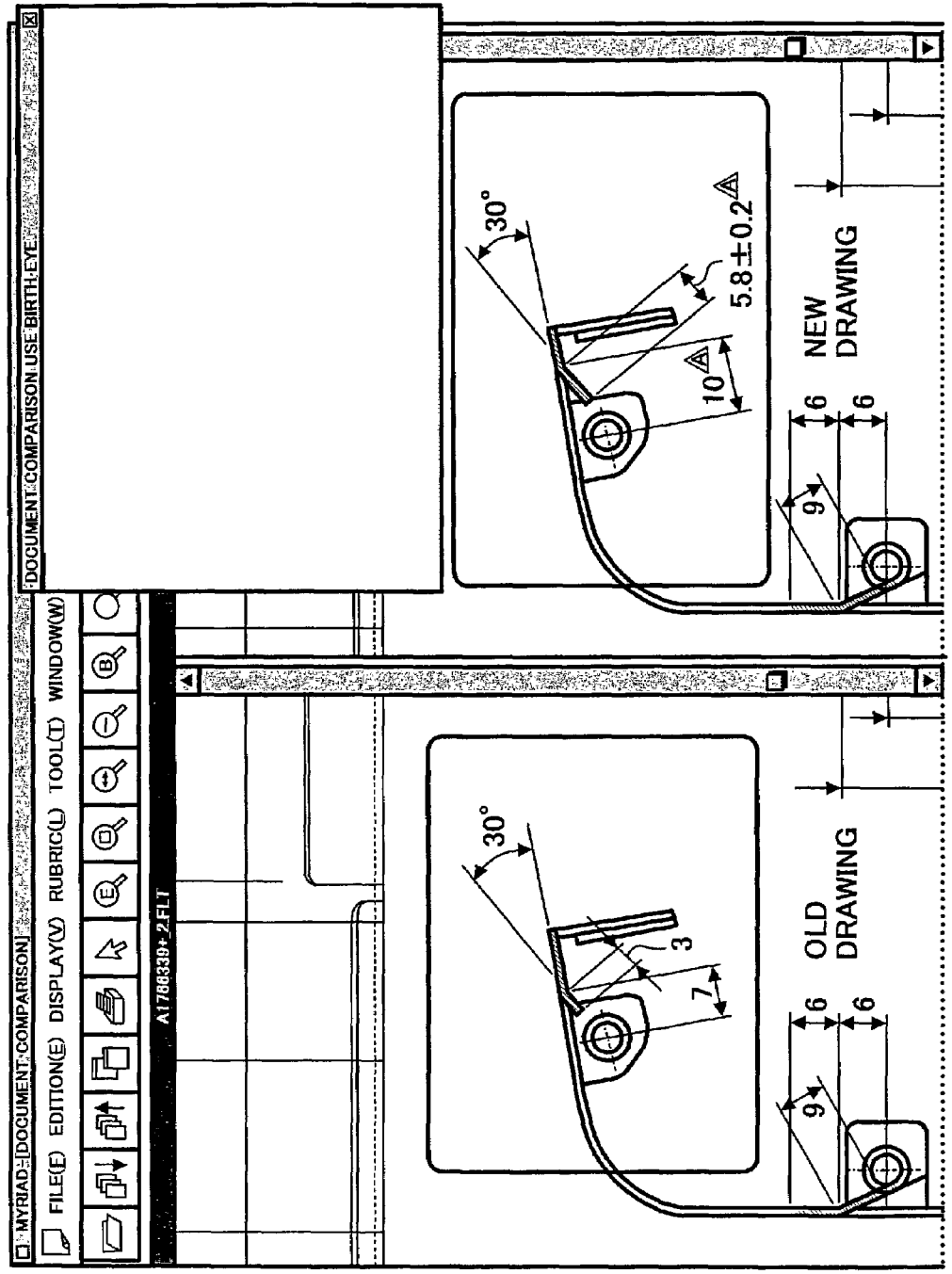
FIG. 10 is a chart illustrating an example of a screen displayed by a document comparison function.

Further, the document comparison enables an inspector to immediately confirm the position of a changed portion, because the old and new drawings are retrieved and overlapped so that only a changed portion therebetween is emphasized (see a window of a document comparison use birds eye) as illustrated in FIG. 10. Further, details of the changed contents can be confirmed by cooperatively enlarging and displaying the old and new drawings (see the old and new enlarged drawings).

Figure 11:
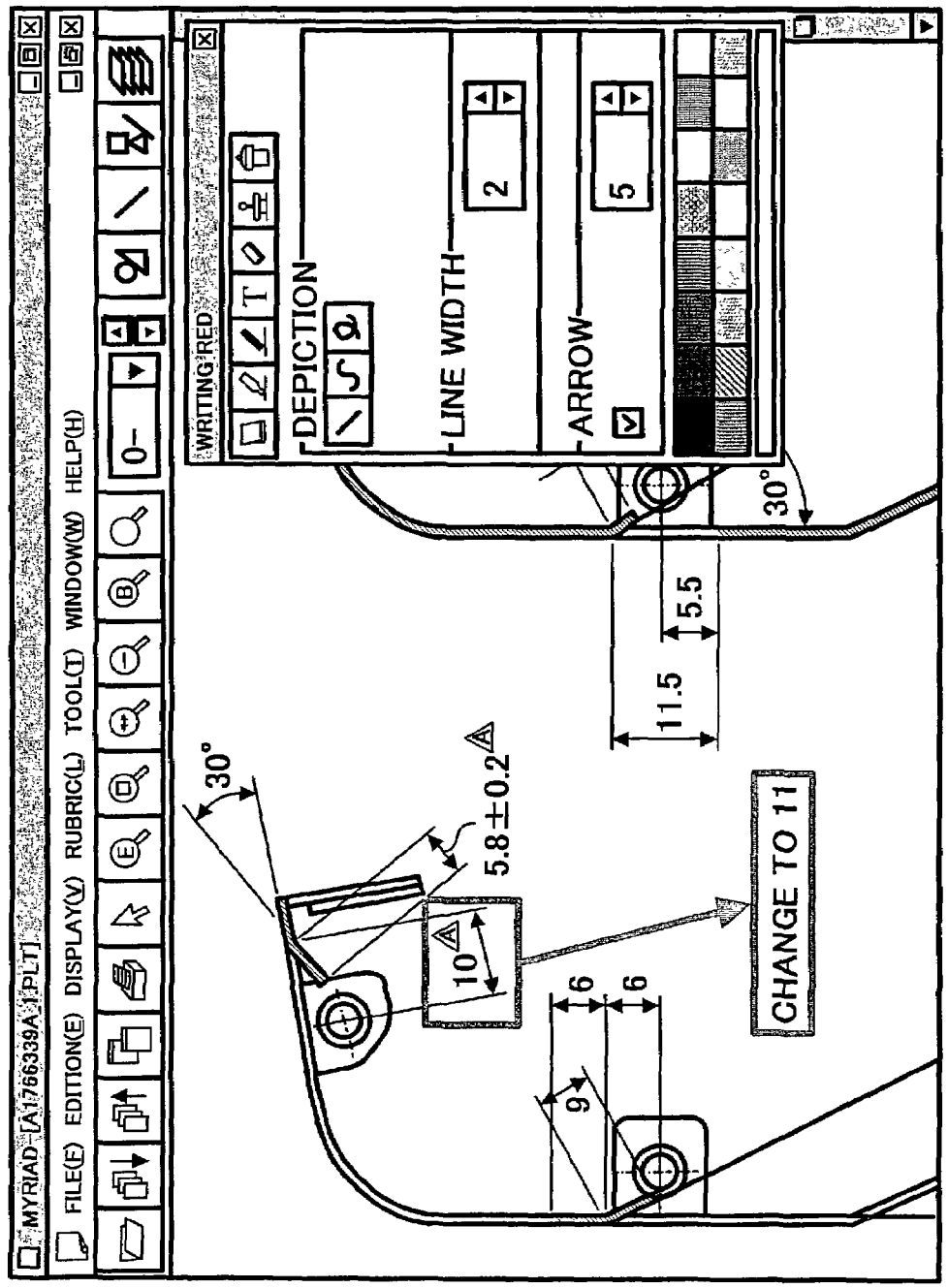
FIG. 11 is a chart illustrating an example of a screen generated and displayed using a rubric function.
Figure 12:
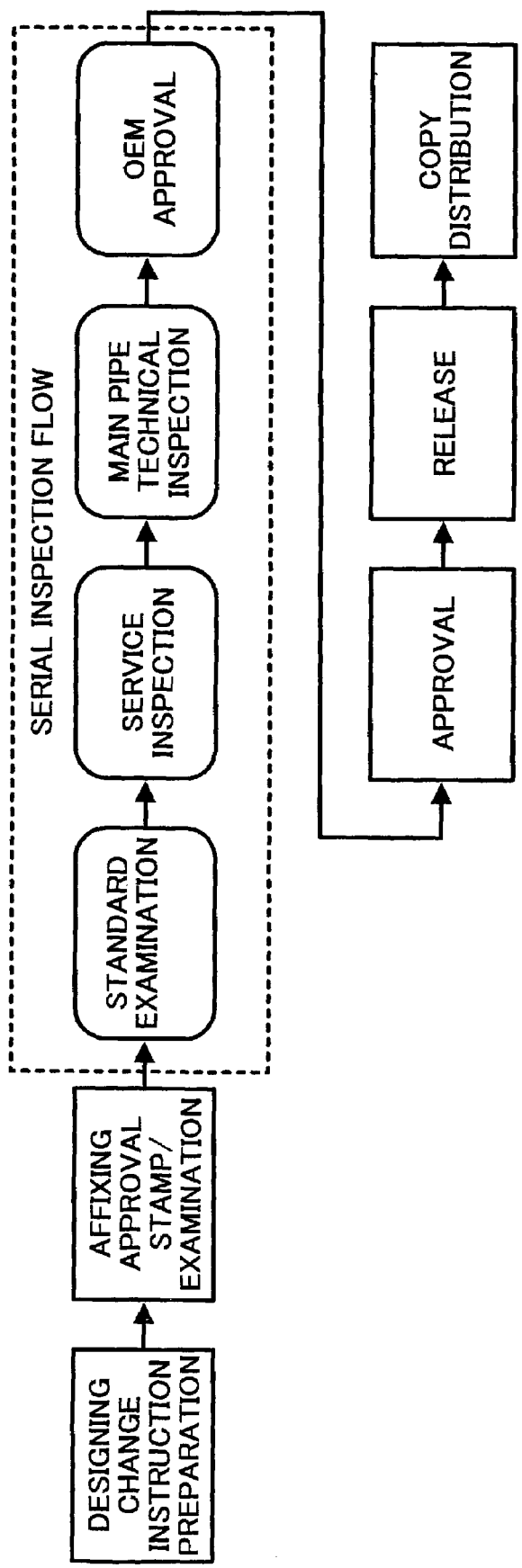
FIG. 12 is an explanatory workflow illustrating a conventional operational flow starting from parts design change to releasing of it.

Further, a function of rubricating a drawing is performed by giving a rubric to a layer overlapped on the drawing in the display. Such rubric data is also registered with the design change instruction database (DB) 195 as a child document of the design change instruction. As shown in FIG. 11, the designer can markup the changed portion with an image of marking the changed portion with a red pen using the rubric function so that inspection contents can be viewed at a glance.

Further, the present invention is not limited to the above-described embodiments.

Specifically, if each function that constitutes the above-described embodiment of the design change supporting system can be made into program, and the program can be stored on a recording medium such as a CD-ROM, etc., the CD-ROM can be attached in computer mounting a medium driving apparatus such as a CD-ROM drive, and the program is stored and executed in each memory of the computer. Thereby, the object of the present invention can be achieved.

The recording medium can be any one of a semiconductor medium, such as a ROM, a non-volatile memory card, etc., an optical medium, such as a DVD, a MO, a MD, a CD-R, etc., and magnetic medium, such as a magnetic tape, a flexible disc, etc.

Further the following case is included in the present invention. An operating system or similar realizes the above-described functions while performing the entire or parts of the actual processing in accordance with instructions of the program loaded thereto.

Further the following case is also included in the present invention. The above-described program is loaded to a memory mounted on a function extension board or unit. In addition, a CPU or similar mounted on the function extension board or unit realizes the above-described functions while performing the entire or parts of the actual processing in accordance with instructions of the program.

Further, the following technique is included in the recording medium of the present invention.

The program is stored in a memory, such as a magnetic disc, etc., of a server computer, and is downloaded by a user computer connected to a network. In addition, a server computer distributes the program in a form of a wire report.

The mechanisms and processes set forth in the present invention may be implemented using one or more conventional general purpose microprocessors and/or signal processors programmed according to the teachings in the present specification as will be appreciated by those skilled in the relevant arts. Appropriate software coding can readily be prepared by skilled programmers based on the teachings of the present disclosure, as will also be apparent to those skilled in the relevant arts. However, as will be readily apparent to those skilled in the art, the present invention also may be implemented by the preparation of application-specific integrated circuits by interconnecting an appropriate network of conventional component circuits or by a combination thereof with one or more conventional general purpose microprocessors and/or signal processors programmed accordingly. The present invention thus also includes a computer-based product which may be hosted on a storage medium and include, but is not limited to, any type of disk including floppy disks, optical disks, CD-ROMs, magnet-optical disks, ROMs, RAMs, EPROMs, EEPROMs, flash memory, magnetic or optical cards, or any type of media suitable for storing electronic instructions.

Numerous additional modifications and variations of the present invention are possible in light of the above teachings. It is therefore to be understood that within the scope of the appended claims, the present invention may be practiced otherwise than as specifically described herein.

What is claimed is:

1. A design change supporting system for supporting a system of changing a design of one or more parts constituting a product, said design change supporting system comprising:

a parts composition information database configured to store and supervise various parts compositions of various products;

a related section information database configured to store various sections and/or persons in charge of assessing capability of design change in connection with a product;

a change parts information inputting device configured to input information related to design change objective parts;

a product specifying device configured to retrieve and specify one or more products employing design change parts from the parts composition information database in accordance with input parts information;

an assessment destination selecting device configured to retrieve and/or select one or more sections and persons from the related section information database in accordance with a specified product;

a transmitting device configured to electronically transmit a request for assessment of a design change capability to the one or more sections and persons selected by the assessment destination selecting device; and a reception device configured to receive resultant of the capability assessment from the one or more sections and/or persons so as to determine if a formal design change instruction can be released, wherein said assessment destination selecting device inhibits a designer from arbitrarily changing the sections and/or persons retrieved from the related section information database in accordance with the specified product, and wherein said related section information database stores one or more sections and/or parsons who totally assess inconsistent design change inspection resultants in connection with the product, and said transmitting device selects and transmits inconsistent inspection resultants to the one or more sections and/or parsons when the assessment resultants received by the reception device are inconsistent with each other.

2. The design change supporting system according to claim 1, wherein said assessment is performed with regard to assembling, processing, servicing performances, conformity to a standard, and necessity of approval from a product OEM product providing destination in connection with the product.

3. The design change supporting system according to claim 1, further comprising:
a drawing database configured to separately store both before and after design changed drawings in connection with a product;
one or more terminal computers adapted to be operated by the one or more sections and/or persons, said one or more terminal computers including a display adapted to display information; and
a display control device configured to display both the before and after design changed drawings on a screen of the display when both the before and after design changed drawings are read from the drawing database in accordance with an instruction from the one or more sections and/or persons.

4. The design change supporting system according to claim 3, wherein said display is performed by displaying a design changed drawing with a design changed portion being prominently emphasized while being superimposed on or below the before design changed drawing.

5. A design change supporting system, comprising:
a changing parts information input device for receiving information relating to a part subject to a design change;
a product specifying device in electronic communication with the changing parts information input device, the product specifying device having a parts composition information database in electronic communication therewith for storing parts compositions for at least one product, the product specifying device configured to retrieve and specify one or more products employing a design change part from the parts composition information database in accordance with a changing parts information input;
an assessment destination selection device for receiving input from the product specifying device, having a related section information database for storing information relating to design change assessment;
a transmitting device for electronically transmitting a request for assessment of a design change to at least one section and/or persons selected by the assessment destination selection device; and
a reception device for receiving a capability assessment from the section and/or persons selected by the assessment destination selection device, wherein said assessment destination selection device inhibits a designer from arbitrarily changing the section and/or persons retrieved from the related section information database in accordance with a specified product, and
wherein said related section information database stores one or more sections and/or parsons who totally assess inconsistent design change inspection resultants in connection with the product, and said transmitting device selects and transmits inconsistent inspection resultants to the one or more sections and/or parsons when the assessment resultants received by the reception device are inconsistent with each other.

6. The system of claim 5, comprising a drawing device updating device.

7. The system of claim 6, wherein the drawing device updating device comprises a drawing data database.

8. The system of claim 7, comprising a display control device capable of simultaneously displaying before and after images of a part subject to a design change.

9. The system of claim 8, further comprising a stored design changed drawing, wherein the most recently stored design changed drawing is stored as a formal drawing in the drawing data database.

10. A computer readable medium having computer software stored thereon, comprising:
changing parts information input means for receiving information relating to a part subject to a design change;
product specifying means in electronic communication with the changing parts information input means, wherein the product specifying means includes a parts composition information database in electronic communication therewith for storing parts compositions for at least one product, the product specifying means configured to retrieve and specify one or more products employing a design change part from the parts composition information database in accordance with a changing parts information input;
assessment destination selection means for receiving input from the product specifying means and having a related section information database for storing information relating to design change assessment;
transmitting means for electronically transmitting a request for assessment of a design change to at least one section and/or persons selected by the assessment destination selection means; and
reception device means for receiving a capability assessment from the section and/or persons selected by the assessment destination selection means, wherein said assessment destination selection means inhibits a designer from arbitrarily changing the section and/or persons retrieved from the related section information database in accordance with a specified product, and
wherein said related section information database stores one or more sections and/or parsons who totally assess inconsistent design change inspection resultants in connection with the product, and said transmitting means selects and transmits inconsistent inspection resultants to the one or more sections and/or parsons when the assessment resultants received by the reception device means are inconsistent with each other.

11. The computer readable medium of claim 10, comprising drawing data updating means.

12. The computer readable medium of claim 10, comprising design change instruction providing including a design change instruction database, wherein the design change instruction database is accessible by the changing parts information input means.

13. A method for implementing a product design change, comprising:
inputting a proposed design change into a changing parts information input device;
querying a parts composition information database;
performing an assessment to determine a feasibility of the design change;
approving a design change instruction;
inputting the design change instruction into a design change database;
selecting a design change destination;
automatically forwarding the design change instruction to a production facility for implementation;

retrieving and specifying one or more products employing a design change part from the parts composition information database in accordance with input parts information, providing a related section information database configured to store various sections and/or persons in charge of assessing capability of design change in connection with a product; and providing an assessment destination selecting device configured to retrieve and/or select the one or more sections and persons from the related section information database in accordance with a specified product, wherein said assessment destination selecting device inhibits a designer from arbitrarily changing the sections and/or persons retrieved from the related section information database in accordance with the specified product, and wherein said related section information database stores one or more sections and/or parsons who totally assess inconsistent design change inspection resultants in connection with the product, and a transmitting device selects and transmits inconsistent inspection resultants to the one or more sections and/or parsons when the assessment resultants received by a reception device are inconsistent with each other.

14. The method of claim 13, comprising updating product drawing data, based on the design change instruction.

15. The method of claim 14, comprising updating a drawing data database to reflect the design change instruction.

16. The method of claim 15, comprising displaying a design changed drawing on a display device.

17. The method of claim 16, comprising simultaneously displaying before and after design changed drawings.

* * * * *